(12) United States Patent
Takeuchi et al.

(10) Patent No.: US 6,395,117 B1
(45) Date of Patent: May 28, 2002

(54) METHOD FOR PRODUCING CERAMIC GREEN SHEET

(75) Inventors: Yukihisa Takeuchi, Nishikamo-gun; Tsutomu Nanataki, Toyoake; Hisanori Yamamoto, Nagoya; Katsuyuki Takeuchi, Ama-gun, all of (JP)

(73) Assignee: NGK Insulators, Nagoya (JP)

( * ) Notice: Subject to any disclaimer, the term of this patent is extended or adjusted under 35 U.S.C. 154(b) by 0 days.

(21) Appl. No.: 09/409,703

(22) Filed: Oct. 1, 1999

Related U.S. Application Data

(63) Continuation-in-part of application No. 09/080,293, filed on May 18, 1998, now Pat. No. 6,051,171, which is a continuation-in-part of application No. 08/538,413, filed on Oct. 2, 1995, now Pat. No. 5,753,160.

(30) Foreign Application Priority Data

Oct. 19, 1994 (JP) ............................................. 6-253858

(51) Int. Cl.$^7$ ..................... B32B 31/26; C04B 35/626
(52) U.S. Cl. .................... 156/89.11; 264/650; 264/669; 264/670
(58) Field of Search ............................ 156/89.11, 89.12; 264/650, 669, 670, 681, 682, 683

(56) References Cited

U.S. PATENT DOCUMENTS

| | | | |
|---|---|---|---|
| 2,893,102 A | | 7/1959 | Maxwell et al. ............... 25/156 |
| 4,045,412 A | * | 8/1977 | Yamada et al. |
| 4,341,725 A | | 7/1982 | Weaver et al. ................. 264/28 |
| 4,772,576 A | | 9/1988 | Kimura et al. ............... 501/105 |
| 4,774,211 A | | 9/1988 | Hamilton et al. ........... 504/153 |
| 5,002,909 A | | 3/1991 | Montino et al. ............ 501/105 |
| 5,238,627 A | | 8/1993 | Matsuhisa et al. ............ 264/63 |
| 5,338,713 A | | 8/1994 | Takagi et al. ................ 501/105 |
| 5,503,787 A | * | 4/1996 | Tanei et al. |
| 5,505,865 A | | 4/1996 | Kumar et al. ............. 252/62.62 |
| 5,733,499 A | | 3/1998 | Takeuchi et al. ............. 264/650 |
| 5,753,160 A | | 5/1998 | Takeuchi et al. ........... 264/40.1 |
| 5,955,392 A | * | 9/1999 | Takeuchi et al. |
| 6,051,171 A | * | 4/2000 | Takeuchi et al. |

FOREIGN PATENT DOCUMENTS

| | | |
|---|---|---|
| EP | 0 133 509 A3 | 2/1985 |
| EP | 0 345 022 A1 | 12/1989 |
| EP | 0 406 578 A2 | 1/1991 |
| EP | 0 708 068 A1 | 4/1996 |
| EP | 0 711 738 * | 5/1996 |
| EP | 0 959 056 A1 | 11/1999 |
| JP | 05-82339 B2 | 11/1993 |

OTHER PUBLICATIONS

David W. Richerson, Modern Ceramic Engineering, Marcel Dekker, Inc., 2nd Edition, 1992, pp. 386–391, 405.*

* cited by examiner

*Primary Examiner*—Curtis Mayes
(74) *Attorney, Agent, or Firm*—Kubovcik & Kubovcik

(57) ABSTRACT

Provided are a method for producing ceramic green sheets used for making a ceramic substrate which is reduced in cracking failure and improved in adhesion between laminated layers and is high in lamination property, high in strength and excellent in surface roughness, said method including heat-treating the ceramic powder having a specific particle size by dry grinding a ceramic powder to prepare ceramic powder having a specific average degree of aggregation and preparing a slurry using the ceramic powder so that a green density of the resulting ceramic green sheets is in a desired range, and a method for making a ceramic laminated substrate having excellent various properties by laminating the above ceramic green sheets and firing the laminate.

4 Claims, 1 Drawing Sheet

METHOD FOR PRODUCING CERAMIC GREEN SHEET

CROSS REFERENCE TO RELATED APPLICATIONS

This application is a continuation-in-part of U.S. Ser. No. 09/080,293 filed May 18, 1998, now U.S. Pat. No. 6,051,171, which is a continuation-in-part of U.S. Ser. No. 08/538,413 filed Oct. 2, 1995, now U.S. Pat. No. 5,753,160.

BACKGROUND OF THE INVENTION AND RELATED ART STATEMENT

The present invention relates to a method for producing ceramic green sheets, and particularly to a method for producing ceramic green sheets suitable for the production of precision ceramic laminate substrates, and a method for producing ceramic laminate substrates of high precision which comprises laminating the ceramic green sheets produced by the above method of production of ceramic green sheets, and firing the laminate.

As a method for controlling firing shrinkage of ceramic molded products, the inventors proposed in U.S. Pat. No. 5,753,160 issued on May 19, 1998 a method for controlling the firing shrinkage of ceramic molded bodies which comprises subjecting a ceramic powder to a pre-treatment to obtain a ceramic powder having a spherical diameter Rs of 1 μm or less represented by Rs $(\mu m)=6/\rho S$ (wherein $\rho$ denotes a true density ($g/cm^3$) of the ceramic powder, and S denotes a BET specific surface area ($m^2/g$)), then subjecting the resulting ceramic powder to a heat treatment at a treating temperature previously calculated, and thereafter molding and firing the ceramic powder.

Furthermore, as related art, the inventors proposed in U.S. Ser. No. 09/080,293 filed May 18, 1998, now U.S. Pat. No. 6,051,171, which is a continuation-in-part of the U.S. patent referred to above a method of producing a fired molded body which comprises the steps of:

(a) molding a ceramic powder (A) having a spherical diameter Rs of 1 μm or less expressed by the formula Rs $(\mu m)=6/\rho S$ (wherein $\rho$ denotes a true density ($g/cm^3$) of the ceramic powder, and S denotes a BET specific surface area ($m^2/g$)) and having an average degree of aggregation (X) of 2 to 10 expressed by the formula X=Rm/Rs (wherein X denotes an average degree of aggregation before heat treatment, Rm denotes a median diameter (μm) before heat treatment measured by a laser scattering method and Rs denotes a spherical diameter (μm) of the ceramic powder), and (b) firing the green molded body at a predetermined firing temperature;

said method being characterized in that the rate of firing shrinkage of said green molded body during the firing step (b) is controlled to a desired value $A_1$ by heat-treating ceramic powders at a temperature $T_1$ that can provide said firing shrinkage value $A_1$, said temperature $T_1$ being determined based on an established correlation between an amount of firing shrinkage at said predetermined firing temperature and a heat-treating temperature, said correlation being obtained by the following steps:

(i) subjecting a ceramic powder (B) having Rs of 1 μm or less and an average degree of aggregation of 2–10 to heat treatments before molding at at least two temperatures, said ceramic powder (B) having a composition similar to said ceramic powder (A) (in such a manner that a total amount of the greatest common contents of individual components common between said both powders) is 90% by weight or more, and satisfying such a relation that Rs of said ceramic powder (A) is within the range of ±30% of Rs of said ceramic powder (B) and the average degree of aggregation of said ceramic powder (A) is within the range of from ½ to 2 fold relative to that of the ceramic powder (B), then producing a molded body, and firing the molded body at the predetermined firing temperature to obtain firing shrinkage values corresponding to said at least two heat treating temperatures, thereby obtaining a regression line for the correlation between the heat-treating temperature and the firing shrinkage, (ii) subjecting a small amount of the powder (A) to be molded in the step (a) to one heat treatment before molding, molding the powder, and firing the molded body at the predetermined firing temperature to obtain a firing shrinkage value at said one heat treating temperature, and (iii) on the basis of the firing shrinkage value of the powder (A) obtained in the (ii) and the regression line obtained in the (i) on the powder (B), establishing said correlation by assuming that its regression line for the relationship between the heat-treating temperature and the firing shrinkage value of the powder (A) is correspondingly offset, in the direction of the axis for the firing shrinkage value in a graph obtained on the ceramic powder (B).

The above two methods have clarified a method of controlling the firing shrinkage of green sheets, in other words, can be said to propose methods for producing green sheets which can be controlled in firing shrinkage. However, when the methods are applied as they are, there are problems that green sheets diminished in occurrence of cracks and superior in lamination property cannot be obtained. On the other hand, for producing ceramic laminated substrates which are high in strength and superior in surface roughness even though being multilayered and precise, it is necessary to use a ceramic powder fine in particle size. However, when ceramic green sheets are produced using the powder of fine particle size, there are problems that cracks occur and ceramic laminated substrates cannot be produced, or green density of the green sheets (density of green sheet) markedly lowers and the laminated substrates are apt to be distorted at the time of lamination. Furthermore, the above problems per se can be solved by using raw materials subjected to dry grinding, but green density of ceramic green sheets becomes too high and adhesion between layers in lamination is inferior.

SUMMARY OF THE INVENTION

An object of the present invention is to provide a method for producing ceramic green sheets for making a ceramic laminated substrate which is reduced in occurrence of cracks in the green sheets and improved in adhesion between laminated layers after firing of the substrate, high in strength, and excellent in surface roughness, by use of a dry ground ceramic powder having a fine particle size with controlling the void content and content of organic components in the ceramic green sheets within desired ranges. Another object of the present invention is to provide a method for producing a ceramic laminated substrate excellent in adhesion between laminated layers, high in strength, and excellent in surface roughness by laminating and firing the ceramic green sheets obtained above.

As a result of intensive research conducted by the inventors in an attempt to attain the above objects, it has been found that the above objects can be attained by preparing ceramic green sheets having a predetermined void content and a predetermined organic component ratio by a wet method using a ceramic powder adjusted to have a spherical diameter within a predetermined range by dry grinding and subjected to a heat treatment at a predetermined temperature to adjust the average degree of aggregation X' to a predetermined range. Thus, the present invention has been accomplished.

The method for producing a ceramic green sheet according to the present invention is characterized by comprising:

a step of subjecting a ceramic powder to dry grinding so that a spherical diameter Rs satisfies $0.01 \leq Rs \leq 0.5$ [wherein Rs ($\mu$m) means $6/\rho_c S$ (in which $\rho_c$ denotes a true density (g/cm$^3$) of the ceramic powder, and S denotes a BET specific surface area (m$^2$/g) of the ceramic powder)], a step of heat-treating the dry ground powder at a temperature of 250–1000° C. to adjust an average degree of aggregation X' represented by the formula X'=R'm/Rs [wherein R'm means a median diameter ($\mu$m) of the ceramic powder measured by a laser scattering method after the heat treatment and Rs ($\mu$m) has the same meaning as defined above] to a range of 2.5–15, a step of mixing the thus heat-treated powder with organic components in such an amount that the organic components occupy 20–55% of the ceramic green sheet in volumetric ratio and the void content of the ceramic green sheet satisfies 5–25% and a solvent in a necessary amount, thereby preparing a ceramic slurry, and a step of molding the ceramic slurry into a ceramic green sheet.

Furthermore, the present invention provides a method for producing a ceramic laminated substrate, characterized by laminating the resulting ceramic green sheets and firing the laminate.

DETAILED DESCRIPTION OF PREFERRED EMBODIMENTS OF THE INVENTION

Figure 1:
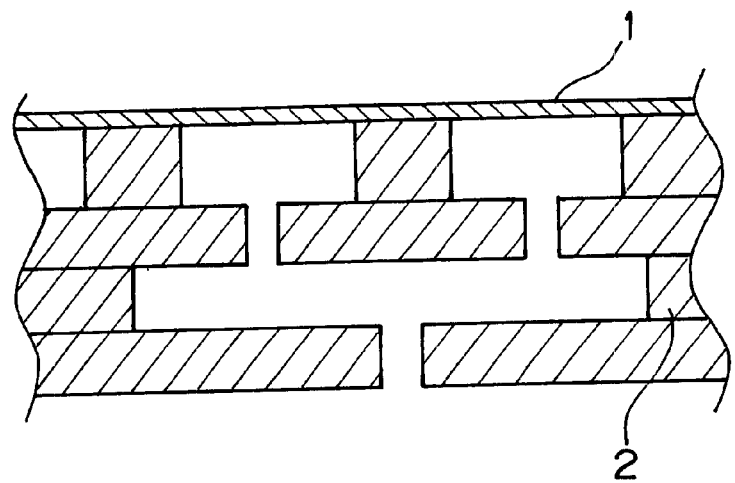
FIG. 1 shows an example of a ceramic green sheet laminate.

The method for producing a ceramic green sheet according to the present invention will be explained in detail below.

In the method for producing a ceramic green sheet according to the present invention, first, a ceramic powder is dry ground so that a spherical diameter Rs satisfies $0.01 \leq Rs \leq 0.5$ [wherein Rs ($\mu$m) means $6/\rho_c S$ (in which $\rho_c$ denotes a true density (g/cm$^3$) of the ceramic powder, and S denotes a BET specific surface area (m$^2$/g) of the ceramic powder)] and is subjected to heat treatment so that an average degree of aggregation X' represented by the formula X'=R'm/Rs [wherein R'm means a median diameter ($\mu$m) of the ceramic powder measured by a laser scattering method after the heat treatment and Rs ($\mu$m) has the same meaning as defined above] is within the range of 2.5–15. Usually, the dry grinding treatment is preferably carried out in the presence of a suitable amount of a grinding aid for improvement of grinding efficiency. As grinders, there maybe used those of various principles in addition to roll mill, oscillating mill, etc. Among them, grinders such as ball mills using ball media and attritors are more preferred because they are superior in grinding efficiency and high in the effect to improve green density of the green sheet. These grinders and grinding conditions are well known to one skilled in the art belonging to the field of processing of ceramics, and proper conditions can be selected from known conditions and further explanation thereof is omitted here. The true density $\rho_c$ of ceramic powder here shows a theoretical density. For example, a partially stabilized zirconia powder containing 3 mol % (5.4% by weight) of yttria has 6.10 g/cm$^3$, and an alumina powder has 3.98 g/cm$^3$. In the case of using powders comprising a plurality of ceramic powders, the true density can be calculated by the following formula. That is, when weight ratios of the amounts of the respective ceramic components are $W_{c1}$, $W_{c2}$, $W_{c3}$ - - - and true specific gravities are $\rho_{c1}$, $P_{c2}$, $P_{c3}$ - - -, the true density can be calculated from $\rho_c=(W_{c1}+W_{c2}+W_{c3}+ - - -)/(W_{c1}/\rho_{c1}+W_{c2}/\rho_{c2}+W_{c3}/\rho_{c3}+ - - -)$. In this case, the same value is obtained when the weight ratios of the respective ceramic components are replaced with weights of the respective ceramic components.

If the spherical diameter Rs of the ceramic powder adjusted by dry grinding is more than 0.5 $\mu$m, the effect of dry grinding and the effect of heat treatment can hardly be obtained, and, furthermore, there are apt to occur problems that strength of substrates as final products lowers and the desired surface roughness cannot be obtained. On the other hand, if Rs is less than 0.01 $\mu$m, not only the green sheets are apt to be distorted at the time of lamination, but also there often occur problems such as variation in firing shrinkage rate and occurrence of cracking at the time of tape molding. Moreover, the surface roughness of the resulting laminated substrate also does not meet the demanded standard. With regard to the surface roughness of the laminated substrate, it is preferably 0.01–0.5 $\mu$m, more preferably 0.05–0.3 $\mu$m in terms of Rs value. The dry grinding is necessary for preparing a ceramic slurry having good fluidity from the ceramic powder. In the case of using a slurry having no desired fluidity prepared from ceramic powder which has not been subjected to the dry grinding, there occur problems that variation in thickness of the molded green sheets is great, the green density lowers much, variation in size of the molded bodies is great, and punch ability of the molded bodies is inferior. When the ceramic powder is subjected to wet grinding after subjected to dry grinding, the above-mentioned problems are usually not caused.

The ceramic powder subjected to dry grinding so as to adjust the spherical diameter Rs to the predetermined value is heat-treated at the desired temperature. The heat-treating temperature is preferably 250–1000° C. If the heat-treating temperature is lower than 250° C., when the heat-treated ceramic powder is molded into ceramic green sheets, there are recognized no effects of improving mold punch ability, lamination property of green sheet laminate, and removability of binder from the laminated green sheets at the time of firing. If the heat-treating temperature exceeds 1000° C., the powder is apt to solidify after the heat treatment and molding sometimes becomes difficult, though it depends on the kind of material of the ceramic powder used. Various atmospheres can be employed for the heat treatment, such as oxidizing, neutral and reducing atmospheres and reduced pressure. When the heat-treating atmosphere is formed with passing a gas, flow rate of the gas has sometimes an effect of removal of grinding aid added at the dry grinding, but substantially no influence exerted on the ceramic materials by the heat treatment. Thus, there is no special limitation in the gas flow rate.

Adjustment is conducted so that after the heat treatment, an average degree of aggregation X' represented by the formula X'=R'm/Rs [wherein R'm means a median diameter ($\mu$m) of the ceramic powder measured by a laser scattering method after the heat treatment and Rs ($\mu$m) has the same meaning as defined above] is within a range of 2.5–15. Furthermore, it is necessary to select the optimum Rs value of the raw material and heat-treating temperature so as to obtain the desired average degree of aggregation after the heat treatment.

Here, the average degree of aggregation X' means a value obtained by dividing, by the Rs, the median diameter R'm of the ceramic powder after the heat treatment measured by a laser scattering method.

The median diameter is measured using a dispersion prepared by weighing accurately 50 mg of the ceramic powder to be measured and charging the powder in a vessel together with 30 ml of a 0.2% aqueous sodium hexametaphosphate solution, followed by dispersing for 1 minute by a homogenizer. For the measurement, was used a laser diffraction/scattering type particle size distribution measurement apparatus Model LA-700 (manufactured by Horiba Seisakusho Co., Ltd.).

The average degree of aggregation is 15 or less, preferably 10 or less. If it exceeds 15, the green sheets obtained using such powder are apt to crack during molding, variation of thickness after molding often occurs, and, besides, adhesive force between the green sheet layers is deteriorated to cause failure in adhesion between layers, namely, insufficient adhesion between layers. Moreover, distortion of the laminate is sometimes caused at lamination. If the content of organic components is increased for solving the above problems, packing of the ceramic powder is deteriorated to cause variation of size after firing and insufficient densification.

The average degree of aggregation is preferably 2.5 or more. This is because the powder having an average degree of aggregation of less than 2.5 is very small in void content to result in cracking at punching by mold and failure in lamination and, in addition, blackening and blistering at the time of firing. The blackening here means a phenomenon that the organic components contained in the green sheet are not completely decomposed and are carbonized during the firing and remains in the products, resulting in blackening of appearance of the fired bodies. The blistering means a phenomenon that bubbles are produced in the resulting laminated substrate after firing the green sheets or ceramic green laminate or these bubbles cause distortion of the substrate.

Of course, it is possible to adjust the void content to the desired range by reducing the amount of organic components added in preparation of slurry, but there may occur deterioration in handle ability of the green sheets, cracking, and deterioration of adhesive force between the green sheets and distortion of the laminate at the time of lamination. As mentioned above, it becomes difficult to obtain good green sheets.

Thus, a ceramic slurry is prepared from the ceramic powder after the heat treatment, and ceramic green sheets are produced from the ceramic slurry. It is preferred to control the void content and the green density of ceramic green sheets within the desired ranges in molding of the green sheets. This is because punch ability of the green sheets can be improved by controlling the void content and the green density within the desired ranges, and, furthermore, lamination property of the laminate and removability of binder from the green sheets at the time of firing can be improved by using the above-mentioned green sheets prepared by punching into a specific shape.

The void content in this specification means a volumetric proportion of void in the ceramic green sheet. In other words, since a ceramic green sheet usually comprises ceramic powder, organic components such as binder and void, the void content can also be defined to be a value obtained by subtracting the volume of the ceramic powder and the organic components such as binder from the volume of the ceramic green sheet, dividing the thus obtained value by the volume of the ceramic green sheet, and then multiplying the resulting value by 100. That is, the void content can be expressed by the following formula (I):

Void content (%)=100−green density×[weight of ceramics/(weight of organic components+weight of ceramics)]×(1/$\rho_c$)×100−organic component ratio (I)

[wherein the weight of ceramics means a total weight of the ceramic powder formulated at the time of preparation of slurry for molding; the green density (g/cm$^3$) is expressed by the following formula (II): green density (g/cm$^3$)=weight of green sheet (g)/[average thickness of green sheet (cm)×area of green sheet (cm$^2$)] - - - (II); and the organic component ratio (%) means a volumetric proportion of the organic components such as binder contained in the ceramic green sheet and is expressed by the following formula (III): organic component ratio (%)=green density×[weight of organic components/(weight of organic components+weight of ceramics)]×(1/$\rho_o$)×100 - - - (III) (wherein the weight of organic components means a total weight of the organic components formulated at the time of preparation of the slurry for molding excluding the solvent, and $\rho_o$ means the true density (g/cm$^3$) of the organic component), and $\rho_c$ means the true density (g/cm$^3$) of the ceramic powder]. The true density of organic components is calculated from the true density of each additive component (for example, binder, plasticizer, dispersant and the like) and weight ratios of the additives. For example, when weight ratios of the respective additives are $W_{o1}$, $W_{o2}$, $W_{o3}$ - - - , and true specific gravities are $\rho_{o1}$, $\rho_{o2}$, $\rho_{o3}$ - - - , the true density ($\rho_o$) of the organic components is calculated from the following formula (IV): $\rho_o$=($W_{o1}$+$W_{o2}$+$W_{o3}$+ - - - )/($W_{o1}/\rho_{o1}$+$W_{o2}/\rho_{o2}$+$W_{o3}/\rho_{o3}$+ - - - (IV). In this case, the same value is also obtained when the weight ratios of the respective additives are replaced with weights of the respective additives.

If the void content is less than 5%, the green sheet is insufficient in flexibility, and, hence, shock absorbability for external force is deteriorated and cracks are apt to occur at the time of mold punching, and, moreover, not only failure of lamination is caused, but also removal of binder is insufficient at the time of firing, and, as a result, the fired body is blackened or partially blistered. On the other hand, if the void content exceeds 25%, green sheets are distorted at lamination or the firing shrinkage rate greatly varies, and the fired body is sometimes not sufficiently densified. The voids are preferably communicated with each other for inhibiting distortion of green sheets and failure of lamination at lamination and the poor removal of binders at the time of firing as well. In order to allow the voids to communicate with each other as much as possible, a suitable void content is needed, and the void content is preferably 10% or more. Furthermore, it is preferred to sufficiently deaerate the prepared ceramic slurry in vacuum before molding for removing pore-like voids (pores) of large diameter. This is because pores have adverse effects such as decrease of strength of the fired body and do not contribute so much to the improvement of lamination property.

The organic component ratio (%) in this specification means a volumetric proportion of the organic components in the green sheet which can be calculated from the above formula (III). The organic components are various aids comprising organic materials such as binder, plasticizer and dispersant added at the time of preparation of the ceramic slurry and/or the ceramic green sheet, excluding organic solvent. These are well known to one skilled in the art of molding of ceramics. If the organic component ratio is less than 20%, distortion at lamination and failure in lamination (insufficient bonding between layers) are apt to occur. If the organic component ratio exceeds 55%, there sometimes occur failures in firing, such as blistering, blackening and insufficient densification at the time of firing of laminated substrate. When the organic components are added, amounts of the organic components used are previously calculated so that the organic component ratio can be the desired value, namely, 20–55%, and they are added in the calculated amounts. It is a matter of course that since the balance in the amounts of the ceramic powder and the organic components is one of the factors determining the organic component ratio and the void content, the balance must be taken into consideration. Balancing of them can be attained by using a ceramic powder which satisfies the above requirements for spherical diameter Rs and average degree of aggregation X' and adjusting so as to obtain desired values using the above formulas (I)–(III). That is, the void content and the green density can be within the predetermined ranges by controlling the packing ratio of the ceramic powder and the organic component ratio. For this purpose, it is necessary to use a ceramic powder having the spherical diameter Rs and the average degree of aggregation X' adjusted to the above ranges. If the packing ratio is lower, flexibility of the prepared green sheet becomes too high, and if the packing ratio is higher, the green sheet lacks flexibility and becomes difficult to mold. Thus, care should be taken in this respect.

The ceramic powder used in the present invention is not limited, and various examples can be illustrated. For example, mention may be made of materials mainly composed of partially stabilized zirconia, stabilized zirconia, alumina, titania, mullite, spinel, beryllia, magnesia, zircon powder, cordierite powder, barium titanate powder, lead titanate powder, lead titanate zirconate powder, silicon nitride, aluminum nitride or the like, or mixtures thereof. Furthermore, as a firing aid, silica, clay, transition metal oxide or the like may be added in an amount of 30% by weight or less based on the main component of the materials. As a stabilizer for the partially stabilized zirconia, there may be used yttria, magnesia, ceria, calcia, ytterbia, and oxides of rare earth metals, and amount of yttria can be 1–8 mol %.

In the method for producing ceramic green sheets according to the present invention, it is preferred to subject the ceramic slurry to vacuum deaeration treatment before the molding step in order to adjust the viscosity of the slurry to the desired value and to remove bubbles in the slurry thereby to remove pores in the molded ceramic green sheets. More preferably, the vacuum deaeration treatment is carried out under heating and/or under reduced pressure of 100 mmHg or lower because removing efficiency for small pores in the slurry can be improved. In this case, the deaeration treatment is carried out until viscosity of the ceramic slurry reaches about 2500–3000 cps. Then, the green sheets are dried generally at about 100° C. though it depends on the kind of the solvent. The drying is preferably carried out by raising the temperature stepwise and/or by gradually drying over a long period of time because not only pores in the ceramic green sheet can be reduced, but also occurrence of failure such as cracking can be diminished. The ceramic laminated substrate according to the present invention can be produced by laminating and firing the ceramic green sheets obtained above. The firing can be carried out under usual conditions.

Figure 2:
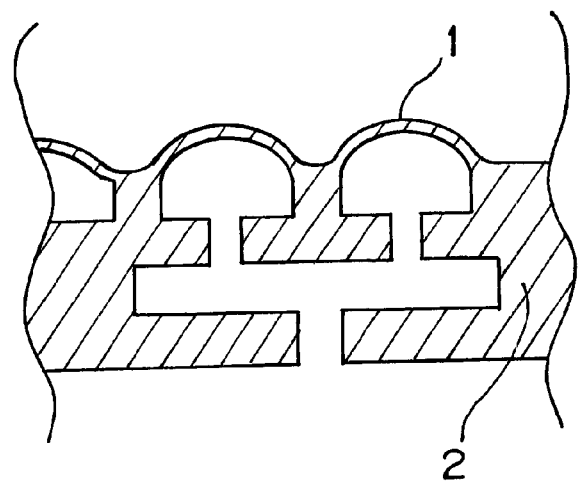
FIG. 2 shows an example of a ceramic laminated substrate.

The ceramic laminated substrate in this specification means a substrate obtained in the following manner. The molded green sheet is punched by a mold or the like into a desired shape; if necessary, in order to further improve the lamination property at the subsequent lamination step, an aiding layer is formed on the surface of the green sheet having the desired shape by coating a resin, adhesive or solvent or printing a paste having a composition similar to the slurry; a plurality of the green sheets with or without the aiding layer are registered and stacked and laminated by pressing them by uniaxial press, cold isostatic press, etc. to obtain a ceramic green sheet laminated substrate; and this laminated substrate is fired. The number of green sheets to be laminated and method of lamination can be optionally selected depending on raw materials for production of the laminated substrate, structure of the laminated substrate, use of the laminated substrate, etc. That is, lamination pressing can be carried out separately or simultaneously, and in case it is carried out separately, there is no limitation in the number of the lamination pressing For reference, as example of the ceramic green sheet laminate, the laminate of five layers is shown in FIG. 1, and an example of the ceramic laminated substrate of five layers is shown in FIG. 2. These are merely examples and do not limit the number of the layers. The aiding layer serves to reduce pressure of the laminate or lamination temperature, and is often used for adjusting lamination conditions. Furthermore, if the resulting fired body of the laminate has warpage or distortion which can be corrected, the warpage or distortion may be corrected by conventional method. That is, the resulting fired body is inserted in a setter and heated to about the maximum temperature at the firing, followed by pressing to correct the warpage or the shape.

Relations between strength characteristics of the ceramic laminated substrate and parameters, a part of which are already mentioned above, will be explained in detail below. As to the "cracking defect" of green sheet, since cracks are present on the surface and in the inside of the laminated substrate, strength of the resulting laminated substrate is considerably deteriorated. If the lamination property of green sheets is inferior, failure in lamination is present inside the laminated substrate, and strength of the laminated substrate is similarly deteriorated. When this is considered relating with the spherical diameter Rs of the ceramic powder, if Rs is less than 0.01 $\mu$m, in addition to the cracking defect, the surface smoothness of the green sheet per se is deteriorated, and, hence, defects caused by them occur on the surface of the resulting substrate after firing to cause decrease of strength of the substrate. Therefore, the spherical diameter of the ceramic powder is 0.01 $\mu$m or more, preferably, 0.05 $\mu$m or more. On the other hand, if it exceeds 0.5 $\mu$m, the surface roughness is deteriorated and strength of the substrate lowers. Therefore, it is preferably 0.5 $\mu$m or less, more preferably 0.3 $\mu$m or less. If the average degree of aggregation exceeds 15, defects are apt to occur on the surface of the resulting substrate and are apt to cause decrease of strength, and, therefore, it is preferably 15 or less. It is more preferably 10 or less. Moreover, denseness of the substrate after fired can be improved by improving the packing ratio at the preparation of the green sheet. Therefore, from the point of strength of the substrate, the packing ratio is preferably 35% or higher, more preferably 40% or higher. Similarly, since defects on the surface and in the inside of the substrate after fired can be reduced by reducing the void content, the void content is preferably 30% or less, more preferably 20% or less.

Relations between the surface roughness of the ceramic laminated substrate and parameters, a part of which are also already mentioned above, will be explained in detail below. Since so-called "cracking defect" of the green sheet leaves scars of cracks on the surface of the laminated substrate, the surface roughness of the resulting laminated substrate is considerably deteriorated. Moreover, since denseness of the substrate after fired can be improved by improving the packing ratio at the preparation of the green sheet, from the point of surface roughness of the substrate, the packing ratio is preferably 35% or higher, more preferably 40% or higher. Similarly, since defects on the surface of the substrate after fired can be reduced by reducing the void content, the void content is preferably 30% or less, more preferably 20% or less. In connection with the spherical diameter Rs of the ceramic powder, if Rs is less than 0.01 µm, in addition to the cracking defect of the green sheet, the surface smoothness of the green sheet per se is also deteriorated, and, hence, the spherical diameter is preferably 0.01 µm or more, more preferably, 0.05 µm or more. On the other hand, since uneven configuration conforming to the size of the ceramic particle remains on the surface of the substrate after fired, the surface roughness of the substrate is improved with decrease of particle diameter, and the diameter is preferably 0.5 µm or less, more preferably, 0.3 µm or less. If the average degree of aggregation exceeds 15, cracks are apt to occur in the green sheet during molding, causing deterioration in the surface roughness of the resulting substrate. When in order to overcome this problem, amount of the organic components is increased, packing ratio is lowered to result in insufficient densification of the substrate after fired and deterioration of the surface roughness of the substrate. Thus, it is preferably 15 or less, more preferably 10 or less.

The method of production of ceramic green sheets according to the present invention can be preferably applied to the production of ceramic structures used for multilayer ceramic substrates, IC substrates, various sensors, actuators, generators, oscillators, displays, microphones, speakers, and filters.

The method of production of green sheets according to the present invention is carried out using a ceramic powder, but can also exert the same effect using a metal powder in place of the ceramic powder.

The present invention will be explained in more detail by the following examples, which never limit the invention.

EXAMPLE

1. Preparation of Green Sheet

The following ceramic powders were subjected to grinding treatment so as to give the spherical diameters as shown in Table 1. Both the dry and wet grinding treatments were carried out for 5–60 minutes in the case of using an attritor (using zirconia balls of 5 mm in diameter), for 2–24 hours in the case of using an oscillating mill (using zirconia balls of 10 mm in diameter) or for 12–48 hours in the case of using a ball mill (using zirconia balls of 10 mm in diameter). The dry grinding was carried out after addition of ethanol as a grinding aid in an amount of 0.6 part by weight to powders A–E, in an amount of 0.9 part by weight to powders F, G and I, and in an amount of 1.2 part by weight to powders H and J based on 100 parts by weight of the powder. After completion of the grinding, the powder was sifted by a screen of 60 mesh and only the powder passing therethrough was used. In the case of wet grinding employed as a comparative example, the grinding was carried out after addition of deionized water in an amount of 150 parts by weight to powders A–E, in an amount of 220 parts by weight to powders F, G and I, and in an amount of 290 parts by weight to powders H and J based on 100 parts by weight of the powder. The thus ground powder was taken out, dried at 150° C. for 15 hours, and then sifted by a screen of 60 mesh and only the powder passing therethrough was used.

Materials of The Ceramic Powder:

As materials A–D, were used four kinds of materials which comprised partially stabilized zirconia (zirconia powder partially stabilized with 3 mol % of $Y_2O_3$) with containing 0.2% of alumina as a firing aid and which differed each other in only particle diameter as shown in Table 1. As material E, was used stabilized zirconia (zirconia powder stabilized with 8 mol % of $Y_2O_3$). As material F, α-alumina of at least 99.9% in purity was used. As material G, γ-alumina of at least 99.9% in purity was used. As material H, mullite ($3Al_2O_3 \cdot 2SiO_2$) of at least 99.9% in purity was used. As material I, γ-alumina of at least 99.9% in purity was used. As material J, mullite ($3Al_2O_3 \cdot 2SiO_2$) of at least 99.9% in purity was used.

Naturally, each of the materials contained unavoidable components such as impurities.

The powder which passed through the screen was heat-treated at a predetermined temperature. The heat-treating temperature shown in Table 1 was the maximum temperature, and the powder was kept at that temperature for 4 hours. For reference, in comparative examples, powders which were not subjected to the heat treatment were also used. The average degree of aggregation after the heat treatment is also shown in Table 1.

2. Preparation of Slurry to be Molded

To each of the above ceramic powders were added organic components, namely, polyvinyl butyral resin (BM-2 manufactured by Sekisui Chemical Co., Ltd.) as a binder, DOP (dioctyl phthalate) as a plasticizer, and a sorbitan fatty acid ester (SP-030 manufactured by Kao Co., Ltd.) as a dispersant, and toluene/2-propanol mixed solution (50/50 in volumetric ratio) as an organic solvent at a predetermined ratio, followed by mixing for 20 hours by a ball mill (using zirconia balls of 10 mm in diameter). Then, the resulting slurry was adjusted in viscosity by vacuum deaeration treatment to prepare a slurry of 3000 cps, and this slurry was molded by a doctor blade machine, and dried at 100° C. for 2 hours to obtain a ceramic green sheet of 150 µm thick. The obtained ceramic green sheet was evaluated on occurrence of cracks.

Evaluation of Lamination Property 1

Five ceramic green sheets obtained above were stacked and were laminated by hot pressing under the conditions of 80° C., 100 kgf/cm², and 3 minutes. Then, the laminate was kept at a maximum keeping temperature of 1400–1600° C. for 2 hours to fire it. Thereafter, occurrence of distortion and cracks at the time of lamination, occurrence of cracks at the time of firing, and occurrence of peeling at interfaces of layers after firing were examined with the naked eye, and lamination property was evaluated. Furthermore, strength characteristics and surface roughness characteristics of the obtained laminated substrate were evaluated.

Evaluation of Lamination Property 2

Five ceramic green sheets obtained above were provided, and an adhesion aiding layer was formed on the surface to be subjected to lamination, by screen printing at a thickness of 5 µm after drying, and dried at 100° C. for 10 minutes.

The adhesion aiding layer used here was prepared from a mixture which was obtained by mixing the same ceramic powder and organic components at the same weight ratio as used for preparation of the slurry for ceramic green sheet and 2-ethylhexanol as a solvent by a ball mill and was adjusted to a viscosity of 40000 cps. The ceramic green sheets each of which had the adhesion aiding layer on the upper surface thereof were stacked and laminated by hot pressing under the conditions of 80° C., 20 kgf/cm$^2$, and 1 minute. Then, the laminate was kept at a maximum keeping temperature of 1400–1600° C. for 2 hours to fire it. Thereafter, occurrence of distortion and cracks at the time of lamination, occurrence of cracks at the time of firing, and occurrence of peeling at interfaces of layers after firing were examined with the naked eye, and lamination property was evaluated. Furthermore, strength characteristics and surface roughness characteristics of the obtained laminated substrate were evaluated.

As shown in Table 1, moldability and lamination property of ceramic green sheets prepared using fine ceramic powder can be improved by employing the method of the present invention.

Ceramic powder is allowed to have a spherical diameter Rs within a predetermined range by dry grinding and is allowed to have a predetermined average degree of aggregation by heat-treating the powder at a predetermined temperature, and, thus, for the first time, green sheets having a suitable void content and a suitable strength and a good lamination property are obtained. That is, more specifically, by using the dry grinding, good fluidity of slurry are obtained in preparing a slurry using the ceramic powder, and a green sheet having a suitable green density can be obtained. Consequently, variation of size in molding of green sheets is small, punchability is satisfactory, and substantially no cracks occur in the tape molding which is often used in firing and molding of a laminate from the green

TABLE 1

| | Starting powder | Grinding conditions | Spherical diameter μm | Heat-treating conditions | Average degree of aggregation | Occurrence of cracks | Organic component ratio (%) | Void content (%) | Lamination property | Strength characteristics | Surface roughness characteristics |
|---|---|---|---|---|---|---|---|---|---|---|---|
| 1 | A | Dry attritor | 0.005 | 400° C. | 14.0 | No | 60 | 15 | X | X | ○ |
| 2 | B | Dry attritor | 0.01 | — | 8.0 | No | 49 | 2 | X | X | ○ |
| 3 | B | Dry attritor | 0.01 | 250° C. | 9.0 | No | 47 | 6 | ○ | ○ | ○ |
| 4 | B | Dry attritor | 0.01 | 500° C. | 15.0 | No | 43 | 14 | ○ | ○ | ○ |
| 5 | C | Dry attritor | 0.15 | 250° C. | 4.7 | No | 40 | 10 | ○ | ○ | ⊙ |
| 6 | C | Dry attritor | 0.15 | 600° C. | 4.9 | No | 50 | 4 | X | X | ⊙ |
| 7 | C | Dry attritor | 0.15 | 600° C. | 4.9 | No | 37 | 17 | ○ | ○ | ⊙ |
| 8 | C | Dry attritor | 0.15 | 600° C. | 4.9 | No | 30 | 25 | ○ | ○ | ⊙ |
| 9 | C | Dry attritor | 0.15 | 1000° C. | 5.8 | No | 40 | 20 | ○ | ○ | oo |
| 10 | C | Dry attritor | 0.15 | 1000° C. | 5.8 | No | 30 | 26 | X | X | ⊙ |
| 11 | C | Dry attritor | 0.15 | — | 4.1 | No | 45 | 2 | X | X | ⊙ |
| 12 | C | Dry attritor | 0.15 | 1300° C. | 6.3 | No | 50 | 28 | X | X | ○ |
| 13 | D | Dry attritor | 0.5 | 1000° C. | 2.5 | No | 30 | 10 | ○ | ○ | ○ |
| 14 | D | Dry attritor | 0.5 | 250° C. | 2.3 | No | 56 | 2 | X | X | ○ |
| 15 | C | Dry oscillating mill | 0.15 | 600° C. | 4.8 | No | 36 | 19 | ○ | ⊙ | ⊙ |
| 16 | C | Dry ball mill | 0.15 | 600° C. | 4.9 | No | 35 | 21 | ○ | ⊙ | ⊙ |
| 17 | C | Dry ball mill | 0.15 | 600° C. | 4.9 | No | 25 | 32 | X | X | ○ |
| 18 | C | Wet attritor | 0.16 | — | 5.1 | Occurred | 35 | 21 | — | — | — |
| 19 | C | Wet attritor | 0.16 | — | 5.1 | Occurred | 45 | 10 | — | — | — |
| 20 | C | Wet attritor | 0.16 | 600° C. | 5.6 | Occurred | 41 | 18 | — | — | — |
| 21 | C | Wet oscillating mill | 0.16 | 600° C. | 5.6 | Occurred | 40 | 20 | — | — | — |
| 22 | C | Wet ball mill | 0.16 | 600° C. | 5.6 | Occurred | 36 | 28 | — | — | — |
| 23 | C | Not ground | 0.17 | — | 5.0 | Occurred | 37 | 26 | — | — | — |
| 24 | E | Dry attritor | 0.15 | 250° C. | 4.4 | No | 39 | 12 | ○ | ⊙ | ⊙ |
| 25 | E | Wet attritor | 0.15 | 250° C. | 5.5 | Occurred | 38 | 14 | — | — | — |
| 26 | F | Dry attritor | 0.05 | 600° C. | 6.0 | No | 45 | 10 | ○ | ⊙ | ⊙ |
| 27 | F | Dry attritor | 0.05 | 600° C. | 6.0 | Occurred | 54 | 1 | — | — | — |
| 28 | F | Wet attritor | 0.05 | 600° C. | 7.2 | Occurred | 41 | 18 | — | — | — |
| 29 | G | Dry attritor | 0.02 | 1000° C. | 8.0 | No | 39 | 14 | ○ | ○ | ○ |
| 30 | I | Dry attritor | 0.01 | 1000° C. | 20.0 | Occurred | 40 | 24 | — | — | — |
| 31 | H | Dry attritor | 0.1 | 1000° C. | 4.8 | No | 40 | 20 | ○ | ⊙ | ⊙ |
| 32 | H | Wet attritor | 0.1 | 1000° C. | 6.1 | Occurred | 35 | 30 | — | — | — |
| 33 | J | Dry attritor | 0.45 | 250° C. | 2.1 | No | 26 | 5 | X | X | ○ |

Note:
In the above table, the symbol "—" in the column of heat-treating condition indicates that heat treatment was not carried out, and the symbol "—" in the column of lamination property indicates that the lamination property could not be determined because of occurrence of cracks. Furthermore, in the column of lamination property, "○" indicates that both the results of lamination evaluation tests 1 and 2 were good, and "X" indicates that both of them were bad. In the column of strength characteristics, "⊙" indicates that the laminated substrate had a sufficent flexural strength measured by four-point bending test using AUTOGRAPH S500 manufactured by Shimadzu Seisakusho, Ltd., "○" indicates that the substrate was usable as a result of the test, "X" indicates that the strength was insufficient, and "—" indicates that the strength could not be measured due to occurrence of cracks. In the column of the surface roughness characteristics, "⊙" indcates that when thin layer wiring and formation of electrode were carried out on the surface of the laminated substrate, the results were good, "○" indicates that the substrate was usable as a result of the wiring and formation of electrode, "X" indicates that the strength of the thin layer wiring and the electrode was insufficient, and "—" indicates that measurement could not be conducted due to occurrence of cracks.

sheets; moreover, the spherical diameter Rs is adjusted to a predetermined range by the dry grinding, whereby distortion at lamination, variation of firing shrinkage rate, and cracking failure at the tape molding are inhibited, and, besides, reduction of strength of substrate and deterioration of surface roughness can be inhibited; furthermore, the average degree of aggregation is adjusted to a predetermined range by heat treatment, whereby void content and green density of the green sheets are made proper, and, thus, improvement in punchability by molding, lamination property and removability of binder at the firing can be attained. These effects are exhibited by the present invention.

What is claimed is:

1. A method for producing a ceramic green sheet which comprises:

a step of subjecting a ceramic powder to dry grinding so that a spherical diameter Rs of the powder satisfies $0.01 \leq Rs \leq 0.5$ [wherein Rs ($\mu$m) means $6/\rho_c S$ (in which $\rho_c$ denotes a true density (g/cm$^3$) of the ceramic powder, and S denotes a BET specific surface area (m$^2$/g) of the ceramic powder)], a step of heat-treating the dry ground powder at a temperature of 250–1000° C. to adjust the average degree of aggregation X' represented by the formula X'=R'm/Rs [wherein R'm means a median diameter ($\mu$m) of the ceramic powder measured by a laser scattering method after the heat treatment and Rs ($\mu$m) has the same meaning as defined above] to a range of 2.5–15, a step of mixing the thus heat-treated powder with organic components in such an amount that the organic components occupy 20–55% of the ceramic green sheet in volumetric ratio and the void content of the ceramic green sheet satisfies 5–25% and a solvent in a necessary amount, thereby preparing a ceramic slurry, and a step of molding the ceramic slurry into a ceramic green sheet.

2. A method according to claim 1, wherein the dry grinding of the ceramic powder is carried out by a grinder using ball media.

3. A method for making a ceramic laminated substrate which comprises laminating ceramic green sheets and firing the laminate, said ceramic green sheets being obtained by a method comprising:

a step of subjecting a ceramic powder to dry grinding so that a spherical diameter Rs of the powder satisfies $0.01 \leq Rs \leq 0.5$ [wherein Rs ($\mu$m) means $6/\rho_c S$ (in which $\rho_c$ denotes a true density (g/cm$^3$) of the ceramic powder, and S denotes a BET specific surface area (m$^2$/g) of the ceramic powder)], a step of heat treating the dry ground powder at a temperature of 250–1000° C. to adjust an average degree of aggregation X' represented by the formula X'=R'm/Rs [wherein R'm means a median diameter ($\mu$m) of the ceramic powder measured by a laser scattering method after the heat treatment and Rs ($\mu$m) has the same meaning as defined above] to a range of 2.5–15, a step of mixing the thus heat-treated powder with organic components in such an amount that the organic components occupy 20–55% of the ceramic green sheet in volumetric ratio and the void content of the ceramic green sheet satisfies 5–25% and a solvent in a necessary amount, thereby preparing a ceramic slurry, and a step of molding the ceramic slurry into a ceramic green sheet.

4. A method according to claim 3, wherein the dry grinding of the ceramic powder is carried out by a grinder using ball media.

* * * * *